(12) United States Patent
Anderson et al.

(10) Patent No.: US 9,190,546 B1
(45) Date of Patent: Nov. 17, 2015

(54) SOLAR PHOTOVOLTAIC REFLECTIVE TROUGH COLLECTION STRUCTURE

(75) Inventors: Benjamin J. Anderson, Albuquerque, NM (US); William C. Sweatt, Albuquerque, NM (US); Murat Okandan, Edgewood, NM (US); Gregory N. Nielson, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 927 days.

(21) Appl. No.: 12/894,772

(22) Filed: Sep. 30, 2010

(51) Int. Cl.
 *H01L 31/00* (2006.01)
 *H01L 31/052* (2014.01)
 *H01L 31/042* (2014.01)
 *H02S 40/22* (2014.01)

(52) U.S. Cl.
 CPC .............. *H01L 31/052* (2013.01); *H02S 20/00* (2013.01); *H02S 40/22* (2014.12); *H01L 31/0422* (2013.01); *H01L 31/0522* (2013.01); *H01L 31/0524* (2013.01); *Y02E 10/52* (2013.01)

(58) Field of Classification Search
 CPC .............. H01L 31/0422; H01L 31/052; H01L 31/0522; H01L 31/0524; H01L 31/0525; Y02E 10/52
 USPC .......................................... 136/243–246, 251
 See application file for complete search history.

(56) References Cited

U.S. PATENT DOCUMENTS

| 4,191,593 | A * | 3/1980 | Cacheux | 136/259 |
|---|---|---|---|---|
| 4,964,713 | A * | 10/1990 | Goetzberger | 359/867 |
| 6,440,769 | B2 | 8/2002 | Peumans et al. | |
| 7,501,752 | B2 | 3/2009 | Ohba et al. | |
| 7,569,764 | B2 | 8/2009 | Shan et al. | |
| 7,737,356 | B2 | 6/2010 | Goldstein | |
| 2003/0070368 | A1* | 4/2003 | Shingleton | 52/173.3 |
| 2005/0081909 | A1* | 4/2005 | Paull | 136/246 |
| 2007/0012311 | A1* | 1/2007 | Yi et al. | 126/573 |
| 2007/0251569 | A1* | 11/2007 | Shan et al. | 136/246 |
| 2008/0066801 | A1* | 3/2008 | Schwarze | 136/251 |
| 2009/0056789 | A1* | 3/2009 | Draganov | 136/246 |
| 2009/0199890 | A1* | 8/2009 | Hering et al. | 136/246 |

OTHER PUBLICATIONS

Kasarova et al., "Analysis of the dispersion of optical plastic materials", Optical Materials, 2007.*

* cited by examiner

*Primary Examiner* — Matthew Martin
(74) *Attorney, Agent, or Firm* — Elmer A. Klavetter

(57) ABSTRACT

A photovoltaic (PV) solar concentration structure having at least two troughs encapsulated in a rectangular parallelepiped optical plastic structure, with the troughs filled with an optical plastic material, the troughs each having a reflective internal surface and approximately parabolic geometry, and the troughs each including photovoltaic cells situated so that light impinging on the optical plastic material will be concentrated onto the photovoltaic cells. Multiple structures can be connected to provide a solar photovoltaic collection system that provides portable, efficient, low-cost electrical power.

16 Claims, 6 Drawing Sheets

SOLAR PHOTOVOLTAIC REFLECTIVE TROUGH COLLECTION STRUCTURE

STATEMENT REGARDING FEDERALLY SPONSORED RESEARCH OR DEVELOPMENT

The Government has rights to this invention pursuant to Contract No. DE-AC04-94AL85000 awarded by the U.S. Department of Energy.

BACKGROUND OF THE INVENTION

The present invention relates to solar trough concentrators for photovoltaic electrical power generation and more particularly, to an encapsulated plate of multiple solar trough concentrators.

Solar trough concentrators comprise a reflective surface and a receiver, such as a photovoltaic cell. Large parabolic trough concentrators, with widths on the order of meters, and a variety of designs are well known. More recently, smaller trough concentrators have been designed to provide for portable, lightweight solar energy systems. Variations in the trough geometries, the reflecting surfaces and the types of receivers have been described.

Useful would be a lightweight, inexpensive, portable solar concentration structure that is flexible in use and efficient in solar energy generation.

BRIEF DESCRIPTION OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings.

DETAILED DESCRIPTION OF THE INVENTION

Figure 1:
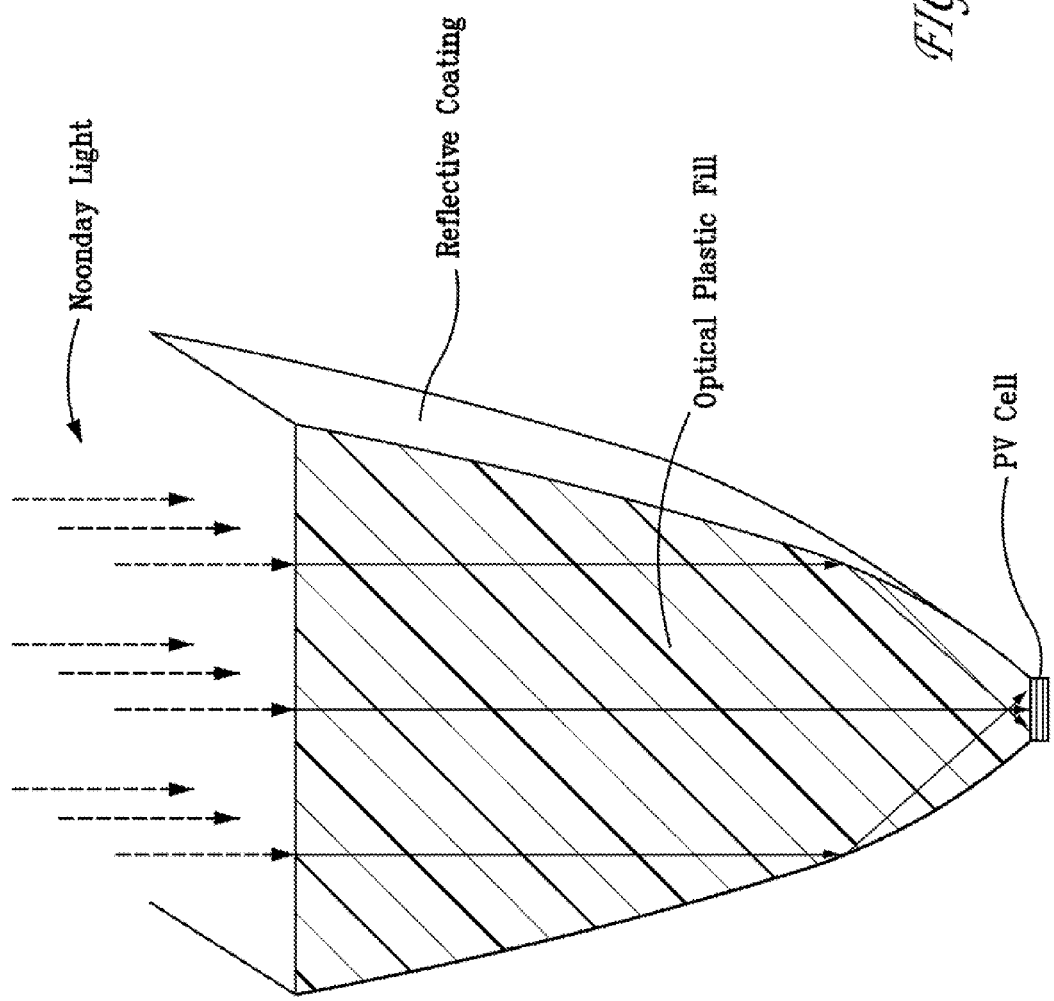
FIG. 1 illustrates cross section of a trough according to the present invention.
Figure 2:
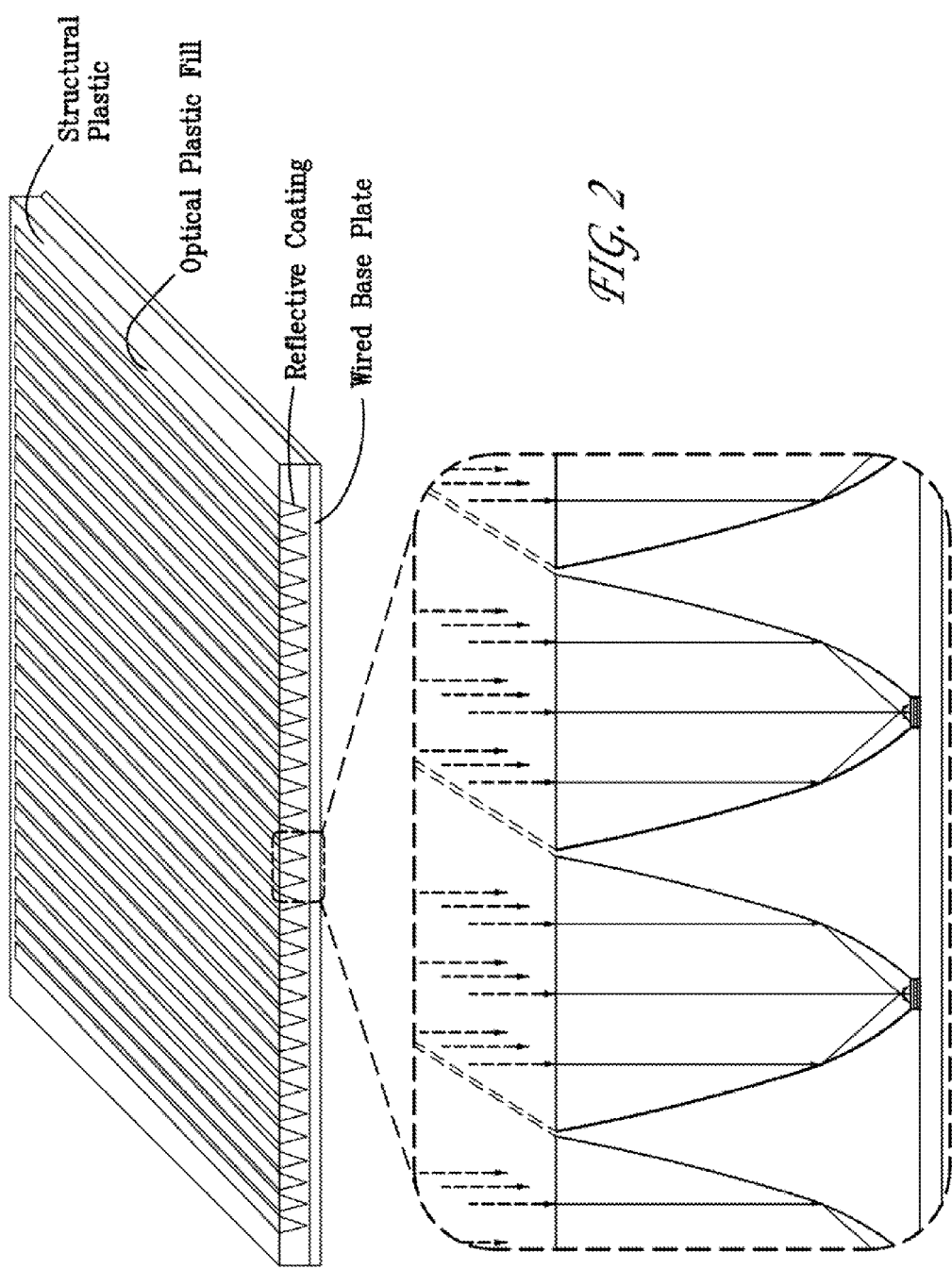
FIG. 2 illustrates the assembly of multiple troughs to form a PV solar concentration plate.

One embodiment of the present invention is a photovoltaic (PV) solar concentration structure comprising at least two troughs molded out of a structural plastic and filled with an optical plastic. The troughs are designed to concentrate impinging light on to PV cells situated within the trough structure. The optical plastic fill creates a smooth top surface that allows surface build-up such as dirt to be easily cleaned away while allowing light to pass into the trough and provides structural support to the trough. The trough side walls each have an approximately parabolic geometry and the internal trough walls are coated with a reflective material to concentrate light on the PV cells at the bottom of the trough. An illustration of a single trough according to the present invention is shown in FIG. 1. In FIG. 2, multiple troughs are assembled to form a solar concentration plate. Multiple closely-spaced parallel troughs can be molded out of a structural plastic and filled with an optical plastic. The interior surfaces of the optical plastic troughs are coated with a reflective metal coating. The PV cells are long and narrow, sitting at the bottom of the troughs. The structural plastic can be the same optical plastic that fills the troughs to facilitate matching of mechanical properties but can be a different (and non-optical) plastic if desired. The PV cells are electrically connected by a base wiring plate and at least one electrical connection through the structural plastic to the external environment is provided. The PV solar concentration plate can have any geometry but a rectangular parallelepiped structure is expected to be most efficient for manufacturing. In one embodiment, the multiple trough PV solar concentrator plate is rectangular parallelepiped with a length and width between 5 cm and 100 cm.

The optical plastic within the trough functions to transmit light onto the photovoltaic cells and in general will have a refractive index generally between 1.3 and 1.8 although materials with a higher or lower refractive index can be used. The optical plastic creates a smooth top surface that allows surface build-up such as dirt to be easily removed in comparison to irregular surfaces of unfilled troughs while still allowing light to pass into the trough. The optical plastic also provides structural support to the trough and a plate of multiple parallel troughs. The higher index optical plastic fill material also allows more alignment error with the sun compared to no fill. Examples of optical plastics that can be used include, but are not limited to polycarbonate, polymethyl methacrylate, polystyrene, polyolefins, styrene methyl methacrylate copolymer, styrene acetonitrile, and methylpentene, as well as these plastics doped with nanoparticles having a high refractive index that raise the apparent index of the plastic material. Filling the troughs with an optical plastic allows a trough of a given cross-section to capture incident light from slightly larger angles perpendicular to the long axis of the trough. In one embodiment, polycarbonate is used as the optical plastic because it has excellent infrared (IR) transmission and a moderately high refractive index (approximately 1.585).

The photovoltaic cells can be of any design or size provided they can be situated at the bottom of the troughs and function to collect the light concentrated by the trough. The PV cells are typically parallel to the entrance face of the trough and fill the bottom of the trough so as to intercept essentially all of the concentrated sunlight. The PV cells or an array of PV cells can have a width of 0.1 mm to 1 mm and a length of 10 cm or more.

Figure 3:
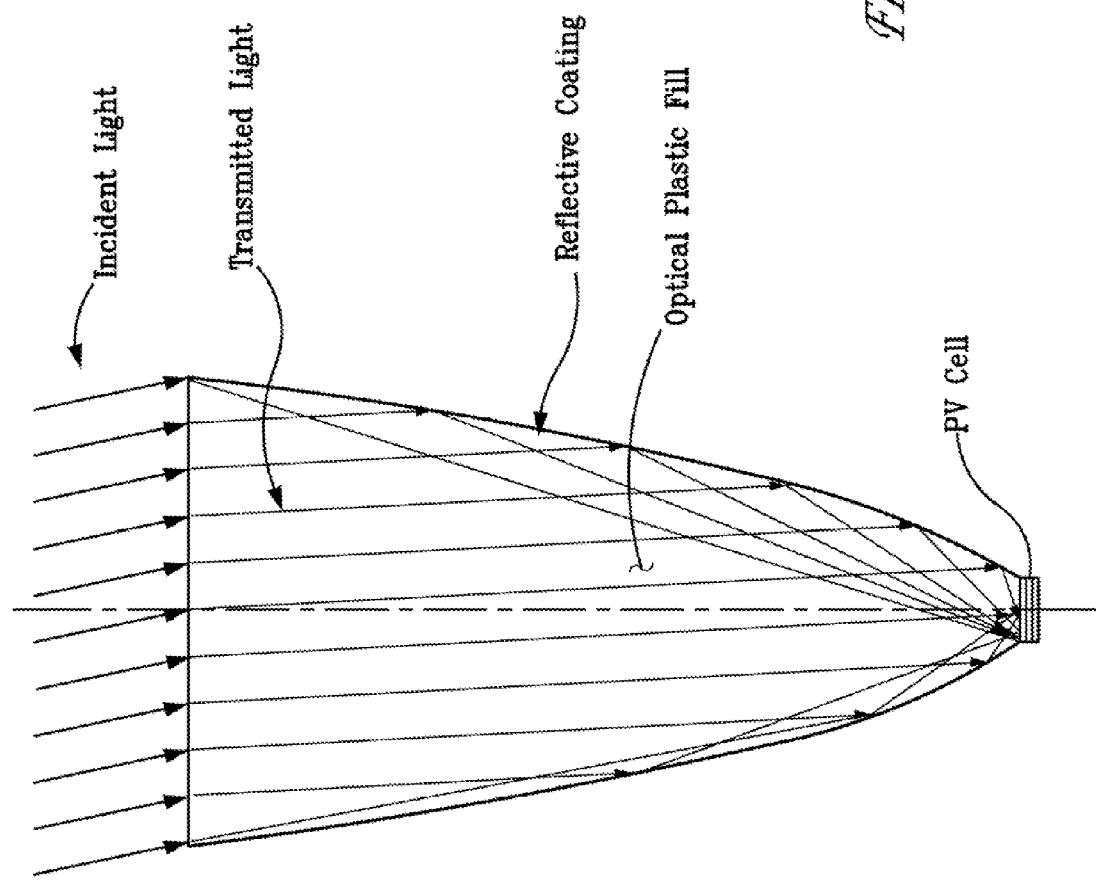
FIG. 3 illustrates one embodiment of a solar concentration trough that has a large angular tolerance of ±5° and a solar concentration of 7.

The trough walls are generally parabolic in geometry but can be of any geometry that serves to concentrate impinging light on the PV cells. The troughs are described by several dimensions: the solar concentration (defined as the ratio of the sunlight intensity impinging upon the PV cell to the sunlight incident on the top surface of the trough) which is approximately 2 to 15; the allowable tilt error (approximately ±0.25° to ±5°) between the normal to the trough entrance surface and the noonday sun that can be accommodated before concentrated sunlight misses the PV cell surface; the ratio of the trough height to trough entrance width which is approximately 0.7 to 3; the ratio of the trough height to the PV cell width which is approximately 3 to 50. Trough height can range from less than 1 mm to greater than 10 mm. In one high-efficiency embodiment, the troughs have a solar concentration of 10 and an angular tolerance of ±1°. The trough height to trough entrance width is 1.7 and the trough height to PV cell width ratio is 17. The trough height is 3.3 mm making the PV cell width 0.2 mm and the weight of a solar concentration plate of multiple troughs approximately 3 kg/m$^2$. Another embodiment allowing a large angular tolerance of ±5° has a solar concentration of 7, a trough height to trough surface width of 1.7 and a trough height to PV cell width of 12. This embodiment is illustrated in FIG. 3. The incident light is drawn more than 5° off normal to the optical plastic fill surface to emphasize the corrective influence of the optical plastic fill on the angular pointing tolerance of the trough. Yet another embodiment designed to minimize weight has an angular tolerance of ±1°, a solar concentration of 7, a trough height to trough entrance width of 1.4, and a trough height to PV cell width of 10. If the PV cell width is 0.1 mm, the plate's weight is approximately 0.75 kg/m$^2$.

In one embodiment, the troughs are coated with a reflective coating on the inner walls that serves to reflect impinging light to the bottom of the trough as is standard in the art. Any metallic coating or film can be used that ensures a high solar reflectance. Materials such as aluminum and silver are commonly used as reflective coatings. Dielectric multilayer coatings should not be used because they cannot give a high reflectivity over the enormous wave band (400 nm to 1600 nm), and over the large range of angles of incidence.

In another embodiment, troughs are not coated with a reflective coating. In this embodiment, the optical plastic fill material has a relatively high refractive index and the structural plastic must have a low refractive index relative to the optical plastic material. In this embodiment, no reflective coating is required as light is totally internally reflected at the interface between the high and low refractive index materials. The parabolic like nature of the side walls can be engineered to maximize the amount of light entering the optical plastic fill that reaches the trough sidewall at an angle greater than the critical angle for total internal reflection. Impinging light is reflected to the base of the troughs to impact the PV cell. The absence of a reflective coating limits the angles of incidence such that only impinging light that is greater than the critical angle is totally reflected. This is in contrast to a reflective coating where incidence angle is not limited.

Figure 4:
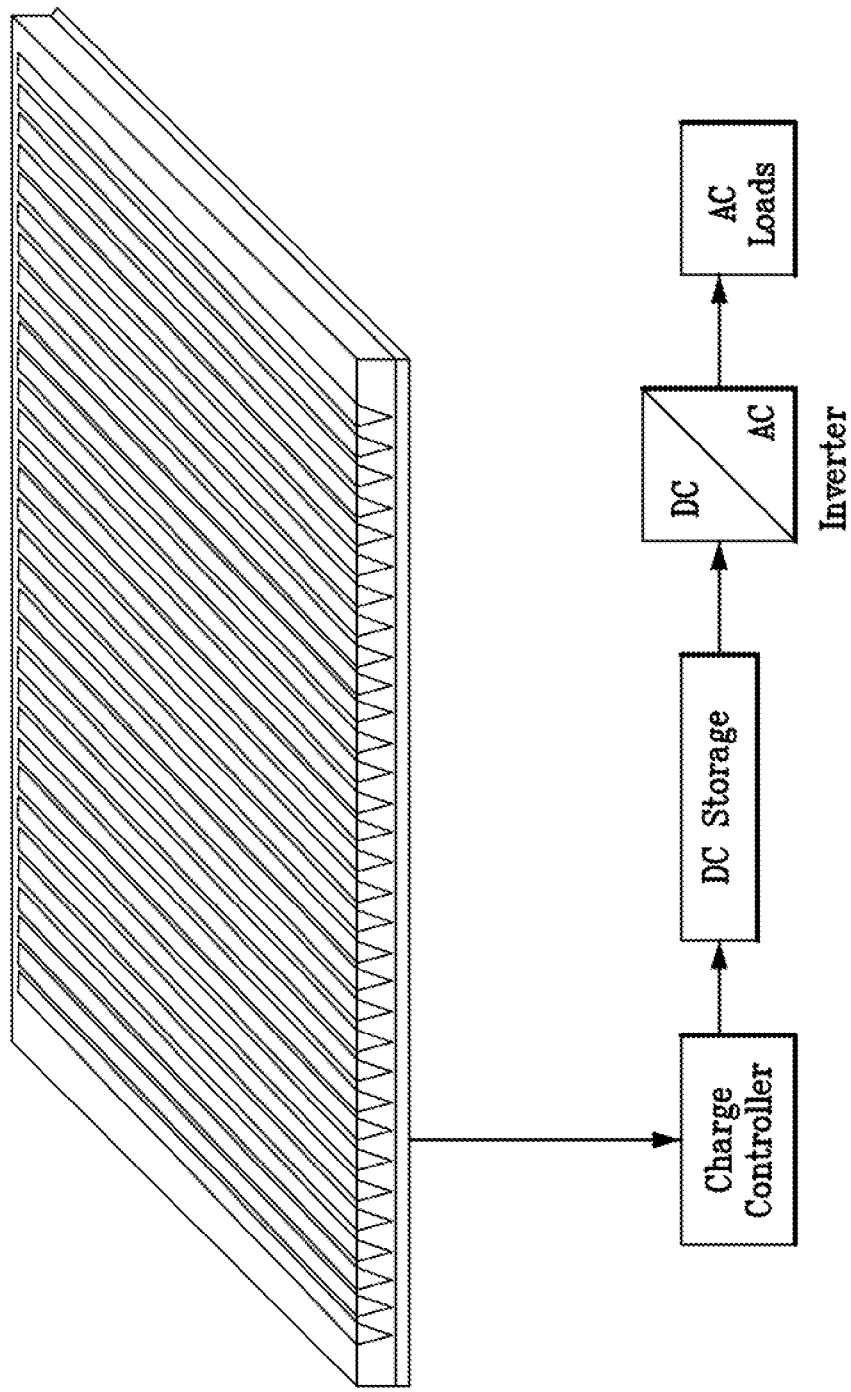
FIG. 4 illustrates one embodiment where PV solar concentration plate is connected to control system to form a solar PV collection system.

FIG. 4 illustrates one embodiment where a solar concentrator plate of multiple troughs with electrically wired photovoltaic cells form a solar collection system for electrical generation that is relatively efficient and has potential use for low-maintenance home PV systems, emergency power, recreational purposes, and military field operations. The solar concentrator plate concentrates sunlight by 2 to 15 times or more onto the PV cells: The plate must be oriented toward the sun's noon-time position for efficiency. In one embodiment, the multiple system of troughs with PV cells at the base overlays a wired base plate that provides the electrical connections between PV cells (and between troughs). The PV solar concentrator plate connects to a control system which can consist of charge controllers, a means for direct current (DC) storage and an inverter to convert the direct current supplied by the PV cells to an alternating current (AC) that can subsequently be supplied to an AC load. In this embodiment, the PV solar concentrator plate is light weight (an effective weight density of approximately 3 kg/m$^2$), quite efficient (>25%), moderately inexpensive, and easy to use and to maintain. Note that the potential increase in solar intensity that can be attained by such a unit increases the efficiency relative to a flat collector by 1.1× and uses about 10% of the expensive (Periodic Table) III-V materials in the PV cells as does a commercially-available flat panel.

Figure 5A:
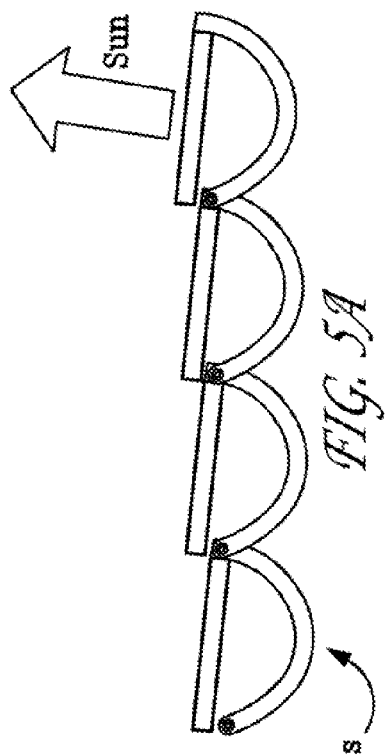
FIG. 5 illustrates (a) an embodiment of the solar PV collection system where multiple PV solar concentration plates are connected to a flexible mounting material wherein the normal vectors of the plates are oriented towards the noonday sun and (b) an embodiment of the solar PV collection system where the flexible mounting material is stretched.
Figure 5B:
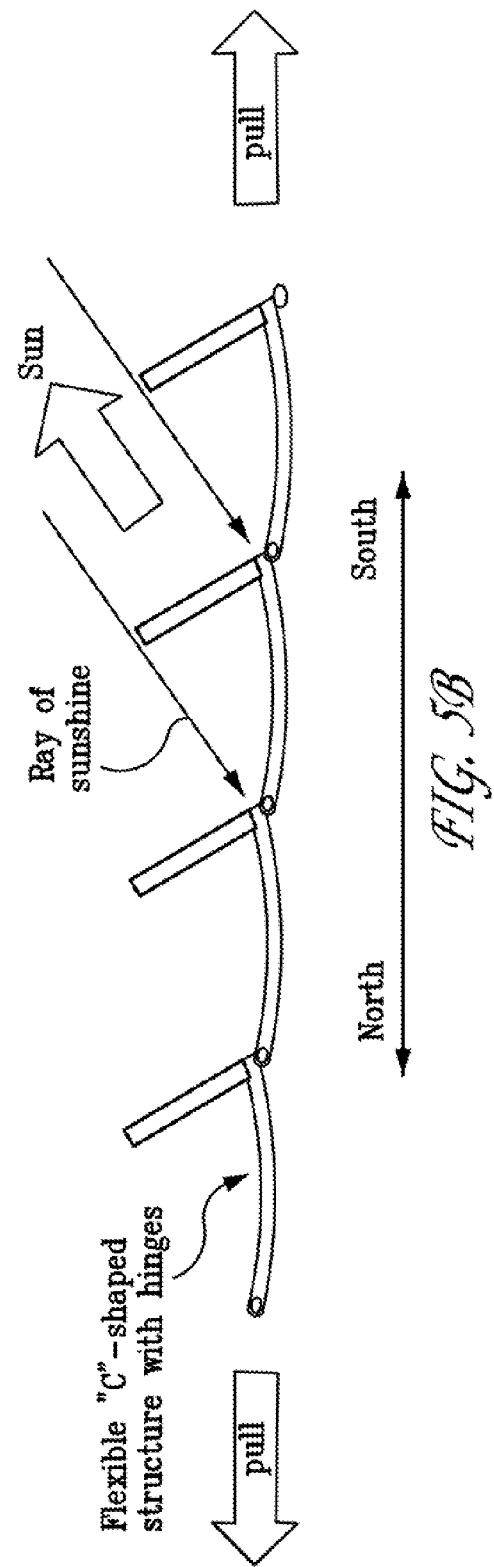

In FIG. 5a, an embodiment of the solar photovoltaic collection system is illustrated where multiple PV solar concentration plates are connected by a flexible mounting material that can be used to control the orientation of the plates. When the flexible mounting material is stretched (see FIG. 5b), the connected plates tilt down so they can be oriented normal to the noon sun position. This design keeps the plates from shading one-another regardless on the solar declination. Depending on the day of the year, the longitudinal position of the sun will be higher or lower in the sky which can mean a movement of tens of degrees. The flexible mounting means allows the longitudinal tilt of the solar concentration plate to be adjusted for maximum solar concentration. The sun moves throughout the day in a plane containing the east-west line and the noonday sun position. The troughs are thus aligned east-west and each plate should be oriented such that it is approximately perpendicular to the sun rays at noonday. With this architecture each trough images the sun (in one dimension) onto its long PV cell all day long without any tracking mechanisms or other moving parts. The geometry and architecture of the plates containing the multiple reflective troughs according to the present invention enable the PV cells to be illuminated with an intensity of up to ten times or more compared to the normal sunlight.

The plates containing the troughs can be incorrectly tilted by as much as 5° in the vertical plane containing the north-south line without affecting the efficiency in some embodiments. Analyses have shown that the vertical tolerance depends on the trough materials, trough component geometry and dimensions. The tilt error relative to design tolerance can vary from less than 1° to up to 5° or more. A tilt error that is 3° greater than the design tolerance reduces the efficiency by about 15%. Rays were traced for the noon sun position and the 3 pm sun position (45° west). Analyses have shown that the difference was proportional to the cosine of the sun angle and was unaffected by any other characteristics of the micro-optics.

Figure 6:
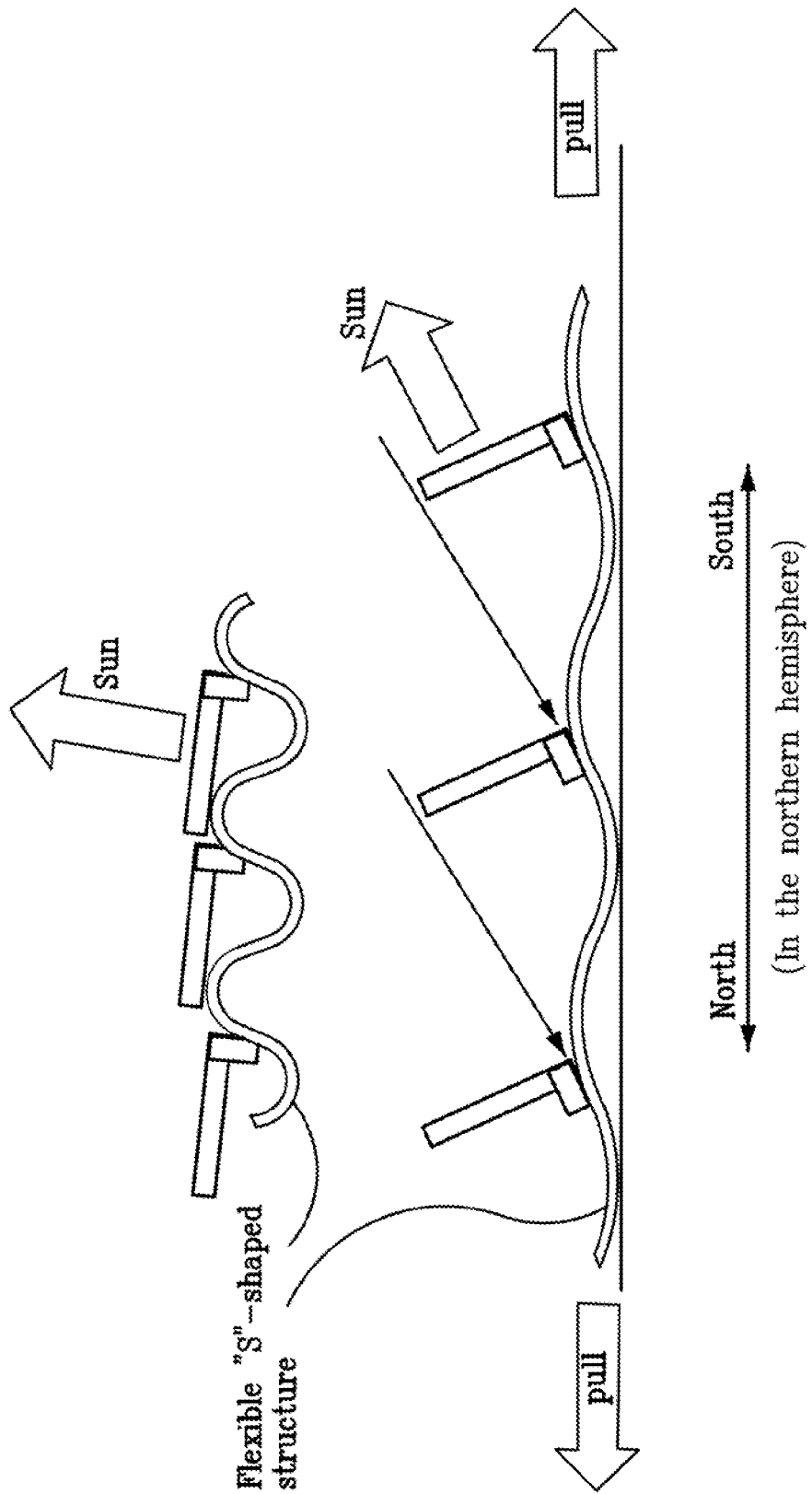
FIG. 6 illustrates an embodiment of the PV collection system where multiple PV solar concentrator plates are connected to the flexible mounting material by flanges.

Another variation of the embodiment shown in FIG. 4 uses a flexible mounting material connected to flanges that connect to each plate, providing a more compact design but also allowing for the flexible mounting material to be either manually or automatically stretched to follow the sun's rays throughout the day. This embodiment is shown in FIG. 6

The installation consists of pinning down the front of the flexible mounting material so that the unit faces south on flat ground or a roof-top. Then the unit is stretched until the plates are properly tilted to face the noonday sun and then the flexible mounting material is fixed in place. Note that with this flexible mounting material, the plates move apart when the support structure is stretched. This keeps the individual solar panels from shading the plates behind them when the sun is low in the sky.

The flexible mounting material can be made of ultraviolet-tolerant rubber or other material or composite material. This flexible mounting material should have sufficient mechanical strength and stiffness and be inherently elastic so that the overall installation containing the multiple plates has a repeatable structure such that each plate will tilt the same amount. Thus the mechanical and material tolerances will have to be good enough to hold a vertical alignment of approximately one degree over a range of angles of approximately 45° in the east-west direction.

In another embodiment, the optical plastic used to fill the trough can be formed to have a curved front (outward facing) surface. The filled troughs can then be encapsulated in a plastic wherein the encapsulated structure has a flat front surface that would be easily cleaned and maintained. This design could allow the length of the troughs to be reduced which would reduce the weight and increases the allowable pointing tolerance. It would also allow the rays at the edge of the field to be somewhat better controlled which can increase the field of view and/or increase the magnification slightly.

Although the invention has been described with reference to one or more particular embodiments, this description is not meant to be construed in a limiting sense. Various modifications of the disclosed embodiments as well as alternative embodiments of the invention will become apparent to persons skilled in the art. It is therefore contemplated that the appended claims will cover any such modification or embodiments that fall within the scope of the invention. The entire disclosures of all references, applications, patents and publications cited above are hereby incorporated by reference.

We claim:

1. Photovoltaic solar concentration apparatus comprising two or more panels, wherein:
    each panel comprises a base plate and a solar concentrator plate having a sunlight-receiving front face and a back face;
    each solar concentrator plate includes a plurality of photovoltaic cells;
    each base plate is juxtaposed to the back face of the corresponding solar concentrator plate and is electrically connected to the corresponding plurality of photovoltaic cells;
    each solar concentrator plate comprises a sheet of polymeric material having a front face coextensive with the front face of the solar concentrator face and a back face coextensive with the back face of the solar concentrator face, wherein a plurality of parallel troughs extend from the front face toward the back face, each trough has a pair of sidewalls and a bottom, at least one photovoltaic cell of said cell plurality is disposed at the bottom of each trough, the sidewalls are reflective toward at least some wavelengths of solar radiation, and the sidewalls of each trough are tapered so as to direct reflected solar radiation onto the photovoltaic cell or cells disposed at the trough bottom; and
    each solar concentrator plate further comprises a fill of polymeric material that encases the plurality of photovoltaic cells and fills the troughs up to the front face, such that the solar concentrator plate is a solid polymer body encasing a plurality of photovoltaic cells;
    the apparatus further comprises a support structure for the two or more panels that continuously adjusts a longitudinal tilt of the panels; and
    the support structure is stretchable and is mechanically coupled to the panels such that stretching the support structure causes all of the panels to tilt by substantially the same amount and simultaneously to be moved farther apart from each other.

2. The photovoltaic solar concentration apparatus of claim 1, wherein the solar concentrator plates each have an approximately rectangular parallelepiped geometry.

3. The photovoltaic solar concentration apparatus of claim 1, wherein each of the solar concentrator plates has a flat front surface.

4. The photovoltaic solar concentration apparatus of claim 1, wherein the polymeric fill material filling each of said troughs has a curved, outward-facing front surface that defines a cylindrical lens.

5. The photovoltaic solar concentration apparatus of claim 1, wherein the polymeric fill material comprises a material selected from polycarbonate, polymethyl methacrylate, polystyrene, polyolefins, styrene methyl methacrylate copolymer, styrene acetonitrile, methylpentene, and optical plastic materials filled with high-refractive-index nanoparticles.

6. The photovoltaic solar concentration apparatus of claim 1, wherein the troughs have a reflective sidewall coating.

7. The photovoltaic solar concentration apparatus of claim 6 wherein said reflective coating comprises a material selected from aluminum and silver.

8. The photovoltaic solar concentration apparatus of claim 1, wherein reflectance at the sidewalls of the troughs results from total internal reflection due to the fill of polymeric material having a higher index of refraction than the plate of polymeric material.

9. The photovoltaic solar concentration apparatus of claim 1, wherein said troughs each have a ratio of trough height to trough entrance width between 0.7 and 3.

10. The photovoltaic solar concentration apparatus of claim 9, wherein the photovoltaic cells have a common width between 0.1 mm and 1 mm.

11. The photovoltaic solar concentration apparatus of claim 10 wherein said trough height is three to fifty times said common photovoltaic cell width.

12. The photovoltaic solar concentration apparatus of claim 10 wherein said troughs have a solar concentration from 2 to 15.

13. The photovoltaic solar concentration apparatus of claim 10 wherein said troughs relay the sunlight to their respective photovoltaic cells with tilting errors between 0.25° and 5° as measured in the north-south vertical plane.

14. The photovoltaic solar concentration apparatus of claim 1, wherein said photovoltaic cells are electrically connected to a control system.

15. The photovoltaic solar concentration apparatus of claim 1, wherein the sidewalls of each trough have a parabolic shape.

16. The photovoltaic solar concentration apparatus of claim 1, wherein the support structure comprises a flexible mounting material that has inherent elastic' such that elastic deformation of the flexible mounting material produces the tilting and the moving of the panels farther apart from each other.

* * * * *